United States Patent [19]

Suzuki et al.

[11] 4,456,975
[45] Jun. 26, 1984

[54] MAGNETIC BUBBLE MEMORY DEVICE WITH GUARDRAIL

[75] Inventors: Ryo Suzuki, Kodaira; Naoki Kodama, Hachioji; Tadashi Ikeda, Kodaira; Yutaka Sugita, Tokorozawa, all of Japan

[73] Assignee: Hitachi, Ltd., Tokyo, Japan

[21] Appl. No.: 345,678

[22] Filed: Feb. 4, 1982

[30] Foreign Application Priority Data

Feb. 6, 1981 [JP] Japan ............................... 56-15038[U]

[51] Int. Cl.³ ............................................. G11C 19/08
[52] U.S. Cl. .................................................... 365/36
[58] Field of Search ........................ 365/35, 36, 41, 37

[56] References Cited

U.S. PATENT DOCUMENTS 4,263,662 4/1981 Keefe et al. ............................ 365/36
4,283,776 8/1981 Nelson .................................... 365/36

Primary Examiner—James W. Moffitt
Attorney, Agent, or Firm—Antonelli, Terry & Wands

[57] ABSTRACT

The magnetic bubble memory device according to this invention comprises an active magnetic bubble memory region formed by implanting ions into a layer of magnetic bubble material, a propagation loop having inner and outer propagation tracks formed by ion implantation so as to surround this region and to propagate captured magnetic bubbles along the circumference of this region, and at least one opening portion provided at the propagation loop so as to propagate magnetic bubbles in the inner propagation track to the outer propagation track.

6 Claims, 6 Drawing Figures

MAGNETIC BUBBLE MEMORY DEVICE WITH GUARDRAIL

BACKGROUND OF THE INVENTION

This invention relates to an improvement of a so-called guardrail for preventing unexpected magnetic bubbles from entering into the active region of an ion-implanted magnetic bubble memory device.

In the normal magnetic bubble memory device, there is provided a magnetic bubble propagation track 7 called a guardrail as shown in FIG. 1 so that unexpected magnetic bubbles can be prevented from entering from the external into an active area 6 of the memory device, which comprises a magnetic bubble generator 1, a write major line 2, minor loops 3, a read major line 4 and a magnetic bubble detector 5. For preventing entrance of unexpected bubbles, the conventional guardrail 7 has magnetic bubble propagation tracks of normal T-bar patterns 9 arranged closely without gap so that magnetic bubbles can be propagated only to the outside from the inside of the guardrail 7, i.e. the active area of the memory, as shown by the enlarged diagram of a partial region 8 in FIG. 2.

However, in the device in which a magnetic bubble propagation track is formed by ion implantation (referred to as ion-implanted device), such a conventional configuration of magnetic bubble propagation track cannot serve as a guardrail. The reason will be briefly described referring to FIG. 3 which shows a partial region 8' corresponding to the region 8 of FIG. 2. If a contiguous disk propagation track 10 is provided, the magnetic bubbles propagated from the inside of the guardrail 7', i.e. from the active memory area 6, to the outside through an upper propagation path 11 are propagated back again from the outside to the inside through the lower propagation path 12 which is contiguous to the upper path 11. In other words, the magnetic bubbles circle around the propagation track 10. As a result, the following problem is caused.

When the propagation path 10 is filled with unexpected or unnecessary bubbles, it can no longer serve as a guardrail and furthermore the magnetic bubbles released from the propagation track 10 may enter into the active memory area 6.

Yet further, if the distance between a pair of adjacent propagation tracks 10 is not small enough, the magnetic bubbles can penetrate through the gap between the propagation tracks. In order to prevent this leakage, it is necessary to construct a guardrail with very closely disposed propagation tracks. This makes the manufacturing process very troublesome.

SUMMARY OF THE INVENTION

Accordingly, it is an object of the invention to provide an ion-implanted magnetic bubble memory device of simple structure and having a guardrail of reliable function.

In accordance with this invention, to achieve the above object, there is proposed a magnetic bubble memory device comprising an active magnetic bubble memory region formed by implanting ions into a layer of magnetic bubble material, a propagation loop having inner and outer propagation paths formed by ion implantation so as to surround the active region and propagate the captured magnetic bubbles around the active region, and at least an opening in the propagation loop, i.e. a connection between the inner and outer propagation paths, for propagating the magnetic bubbles in the inner propagation path to the outer propagation path.

In the magnetic bubble memory device according to this invention, since a guardrail is constructed so that unexpected magnetic bubbles can be captured and propagated around the outer periphery of the active memory region, the tracks other than the opening portion can be formed of continuous patterns. Therefore, the magnetic bubble memory device can be manufactured very easily. Moreover, with this structure, any magnetic bubbles can completely be prevented from going in and out of the active area except through the opening portion, and therefore the guardrail can reliably attain the expected function. While the conventional guardrail is able to drive out the unexpected magnetic bubbles to the outside at any place of the guardrail, the guardrail according to this invention first captures unexpected magnetic bubbles, then propagates them to a predetermined place, i.e. the opening portion, and then drive them out to the outside. Moreover, the unexpected magnetic bubbles existing outside the active area are blocked by the continuously formed propagation track and cannot enter the inside of the guardrail.

DESCRIPTION OF THE PREFERRED EMBODIMENTS

Embodiment 1

Figure 4:
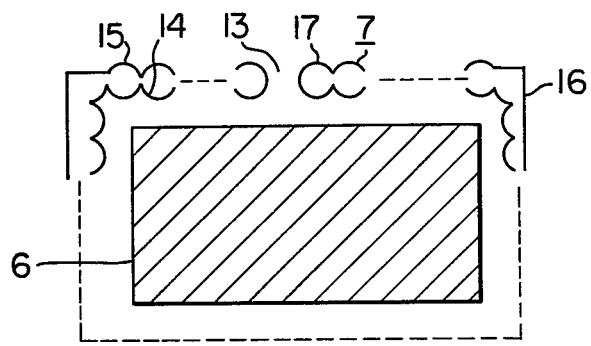
FIG. 4 is a diagram of the guardrail structure of a magnetic bubble memory device according to an embodiment of this invention.
Figure 2:
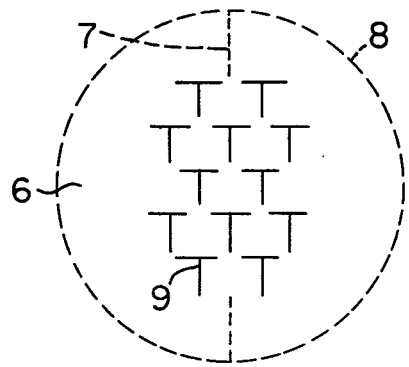
FIGS. 2 and 3 are partially enlarged diagrams for explaining the structures of the conventional guardrail and an imaginary guardrail.

FIG. 4 shows a guardrail of a magnetic bubble memory device according to an embodiment of the invention. Referring to FIG. 4, there are shown the guardrail 7, the active magnetic bubble memory region 6, an opening portion 13, an inner propagation track 14, an outer propagation track 15, a part 16 where magnetic bubbles cannot propagate, and a looped contiguous disk propagation track 17.

The guardrail 7 according to this invention comprises the looped contiguous disk propagation track 17 and the opening 13 of 4 μm width provided at part thereof, which surround the active region 6 of the magnetic bubble memory. The propagation track 17 comprises the inner and outer propagation tracks 14 and 15. The part 16 where magnetic bubbles cannot propagate is a part of the outer propagation track 15 and is not a proper looped contiguous disk propagation track. Magnetic bubbles cannot be propagated in the part 16. The magnetic bubbles used in this embodiment are 1 μm in diameter.

Figure 1:
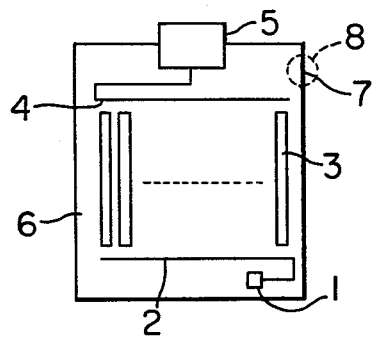
FIG. 1 is an explanatory diagram for explaining the conventional guardrail in the magnetic bubble memory device.

In such guardrail 7, unexpected magnetic bubbles are caught by the inner propagation track 14 of the looped contiguous disk propagation track 17 and propagated to the opening portion 13. The bubbles from the opening portion 13 are propagated to the outer propagation track 15 of the looped contiguous disk propagation track 17. The outer propagation track 15 has the part 16 where magnetic bubbles cannot propagate and thus the propagated bubbles stop at the part 16 and are destroyed in a short time. The bias field margin for the propagation in this guardrail 7 is wider than that of the memory operation and thus causes no problem. The active magnetic bubble memory region 6 comprises various portions of different function as described in connection with FIG. 1. These function portions together with the guardrail 7 are formed by implanting ions into the layer of magnetic bubble material.

Embodiment 2

Figure 5:
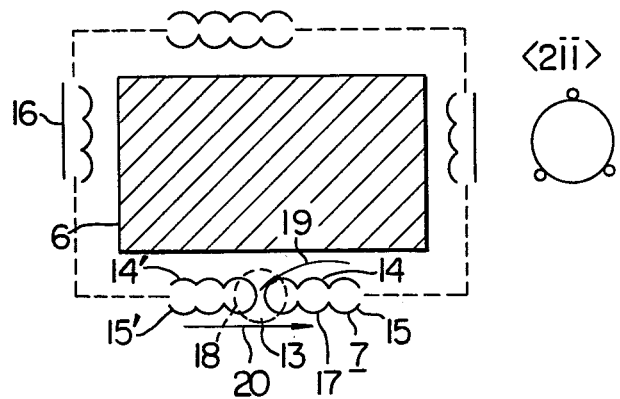
FIGS. 5 and 6 are diagrams of the guardrails according to other embodiments of this invention.
Figure 3:
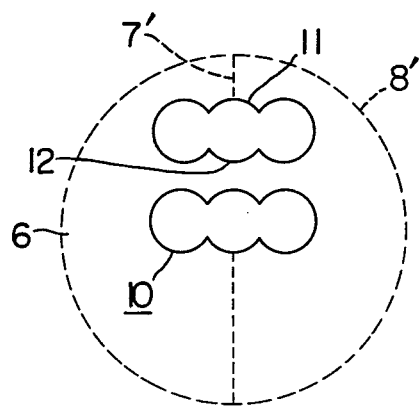

FIG. 5 shows a guardrail according to another embodiment of this invention.

The embodiment 1 has a possibility that unexpected magnetic bubbles enter the active memory region 6 from the opening portion 13, although such probability is very small. In order to prevent such a malfunction, according to this embodiment, a merge track is applied to the opening portion 13 of the looped contiguous disk propagation track 17, which constitutes a more complete guardrail 7. The merge track is a magnetic function unit (in magnetic bubble device) reported in The Bell System Technical Journal Vol. 59, No. 2, February 1980, p. 229 to 257. In an opening portion 13 indicated by a broken-line circle 18 on the lower side of FIG. 5, the magnetic bubbles propagated along an arrowed direction 19, i.e. from the inner propagation track 14, turn the progressing direction by 180° at the opening portion 13 and are propagated along the outer propagation track 15, while the magnetic bubbles propagated along an arrowed direction 20, i.e. from an outer propagation track 15', continue to be propagated in the same direction irrespective of the opening portion 13. In other words, the magnetic bubbles are jumped over the opening portion 13 from the one outer propagation track 15' to the other outer propagation track 15. The distance of the opening portion 13 may preferably be 0.5 to 2 times the diameter of the magnetic bubble to be used. The operation margin depends on the crystal direction in the plane of the layer of magnetic material. As shown in the right-hand side of FIG. 5, it is desirable that the opening portion 13 faces one of three magnetic easy axes. The way of mergence at that time is as described above. Therefore, the magnetic bubbles propagating along the inner propagation track 14 of the looped contiguous disk propagation track 17 are discharged out from the opening portion 13 to the outer propagation track 15, while the magnetic bubbles in the outer propagation track 15' of the looped contiguous disk propagation track 17 do not enter the inner propagation track 14' from the opening portion 13 but are jumped over the opening portion 13 to the outer propagation track 15. In an example of this embodiment, the guardrail having the crystal direction as shown in FIG. 5 and the opening 13 of 1 μm width was used for magnetic bubbles of 1 μm φ and the bias field margin of about 11% was obtained as the guardrail 7.

Embodiment 3

Figure 6:
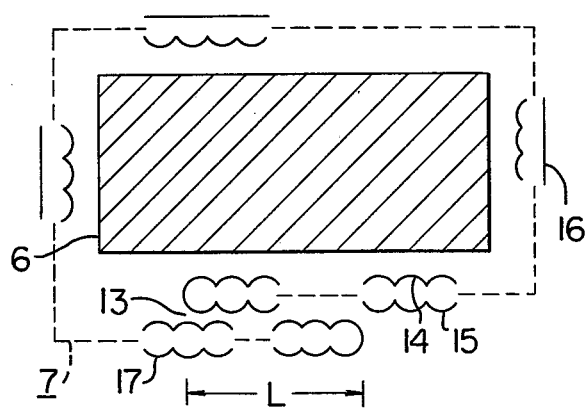

FIG. 6 shows a guardrail according to still another embodiment of the invention.

The feature of this embodiment is that the opening portion 13 is provided along the propagation direction of the looped contiguous disk propagation track 17 to form the guardrail 7 in order to obviate the drawback of the embodiment 1. Such structure of the opening portion 13 is effective for preventing unexpected magnetic bubbles present in the outside from entering the active area 6, i.e. the inside of the looped track, without being caught by the looped contiguous disk propagation track 17. The length L of the overlapped portion of both ends of the looped contiguous disk propagation track 17 may be two unit disk lengths or above of the looped contiguous disk which constitutes the propagation track 17. The gap between the two ends, i.e. the distance between the two ends, at the opening portion 13 is desirably one unit length or below.

As described above, this invention can provide a simple magnetic bubble memory device having a guardrail of assured function, and therefore a highly reliable ion implanted magnetic bubble memory device can be produced.

We claim:

1. A magnetic bubble memory device comprising:
   an active magnetic bubble memory region formed by implanting ions into a layer of magnetic bubble material;
   a propagation loop having inner and outer propagation tracks formed by ion implantation, so as to surround said region and to propagate captured magnetic bubbles along the circumference of said region; and
   at least one opening portion constituting a merge track and provided at said propagation loop so as to propagate magnetic bubbles in said inner propagation track to said outer propagation track.

2. A magnetic bubble memory device according to claim 1, wherein said outer propagation track has a portion incapable of propagating magnetic bubbles.

3. A magnetic bubble memory device according to claim 1, wherein said opening portion faces one of three magnetic easy axes.

4. A magnetic bubble memory device according to claim 1, wherein the distance of said opening portion is 0.5 to two times the diameter of a magnetic bubble to be propagated.

5. A magnetic bubble memory device according to claim 1, wherein said inner and outer propagation tracks have undulating portions for propagating magnetic bubbles therealong.

6. A magnetic bubble memory device according to claim 1, wherein said inner and outer propagation tracks are joined in at least two places by contiguous portions, the contiguous portions being spaced from each other to define said opening portion whereby magnetic bubbles travelling in a predetermined direction adjacent one contiguous portion will jump across said opening portion to the other contiguous portion.

* * * * *